(12) United States Patent
Jiang et al.

(10) Patent No.: US 11,227,797 B2
(45) Date of Patent: Jan. 18, 2022

(54) FILM DEPOSITION USING ENHANCED DIFFUSION PROCESS

(71) Applicant: Applied Materials, Inc., Santa Clara, CA (US)

(72) Inventors: Shishi Jiang, Santa Clara, CA (US); Kurtis Leschkies, San Jose, CA (US); Pramit Manna, Santa Clara, CA (US); Abhijit Mallick, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/675,385

(22) Filed: Nov. 6, 2019

(65) Prior Publication Data

US 2020/0161178 A1 May 21, 2020

Related U.S. Application Data

(60) Provisional application No. 62/768,523, filed on Nov. 16, 2018.

(51) Int. Cl.
*H01L 21/768* (2006.01)
*H01L 21/02* (2006.01)

(52) U.S. Cl.
CPC .. *H01L 21/76837* (2013.01); *H01L 21/02115* (2013.01); *H01L 21/02123* (2013.01);
(Continued)

(58) Field of Classification Search
CPC . H01L 21/02171–0228; H01L 21/0262; H01L 21/76837; H01L 21/76224
See application file for complete search history.

(56) References Cited

U.S. PATENT DOCUMENTS 3,749,383 A 7/1973 Voigt et al.
3,758,316 A 9/1973 Sowards
(Continued)

FOREIGN PATENT DOCUMENTS

CN 101871043 A 10/2010
CN 104047676 A 9/2014
(Continued)

OTHER PUBLICATIONS

International Search Report and Written Opinion for PCT/US2018/021715 dated Jun. 22, 2018.
(Continued)

*Primary Examiner* — John A Bodnar
(74) *Attorney, Agent, or Firm* — Patterson + Sheridan, LLP

(57) ABSTRACT

Embodiments described herein relate to methods of seam-free gapfilling and seam healing that can be carried out using a chamber operable to maintain a supra-atmospheric pressure (e.g., a pressure greater than atmospheric pressure). One embodiment includes positioning a substrate having one or more features formed in a surface of the substrate in a process chamber and exposing the one or more features of the substrate to at least one precursor at a pressure of about 1 bar or greater. Another embodiment includes positioning a substrate having one or more features formed in a surface of the substrate in a process chamber. Each of the one or more features has seams of a material. The seams of the material are exposed to at least one precursor at a pressure of about 1 bar or greater.

20 Claims, 4 Drawing Sheets

(52) U.S. Cl.
CPC .. *H01L 21/02205* (2013.01); *H01L 21/02211* (2013.01); *H01L 21/0228* (2013.01); *H01L 21/02271* (2013.01); *H01L 21/02274* (2013.01)

(56) References Cited

U.S. PATENT DOCUMENTS

| | | | |
|---|---|---|---|
| 4,524,587 | A | 6/1985 | Kantor |
| 4,576,652 | A | 3/1986 | Hovel et al. |
| 4,879,259 | A | 11/1989 | Reynolds et al. |
| 5,050,540 | A | 9/1991 | Lindberg |
| 5,114,513 | A | 5/1992 | Hosokawa et al. |
| 5,126,117 | A | 6/1992 | Schumacher et al. |
| 5,149,378 | A | 9/1992 | Ohmi et al. |
| 5,167,717 | A | 12/1992 | Boitnott |
| 5,175,123 | A | 12/1992 | Vasquez et al. |
| 5,300,320 | A * | 4/1994 | Barron .............. C23C 16/30 257/E21.124 |
| 5,314,541 | A | 5/1994 | Saito et al. |
| 5,319,212 | A | 6/1994 | Tokoro |
| 5,366,905 | A | 11/1994 | Mukai |
| 5,472,812 | A | 12/1995 | Sekine |
| 5,578,132 | A | 11/1996 | Yamaga et al. |
| 5,590,695 | A | 1/1997 | Siegele et al. |
| 5,597,439 | A | 1/1997 | Salzman |
| 5,620,524 | A | 4/1997 | Fan et al. |
| 5,677,230 | A | 10/1997 | Weitzel et al. |
| 5,808,245 | A | 9/1998 | Wiese et al. |
| 5,857,368 | A | 1/1999 | Grunes et al. |
| 5,858,051 | A | 1/1999 | Komiyama et al. |
| 5,879,756 | A | 3/1999 | Fathi et al. |
| 5,880,041 | A | 3/1999 | Ong |
| 5,886,864 | A | 3/1999 | Dvorsky |
| 5,940,985 | A | 8/1999 | Kamikawa et al. |
| 6,082,950 | A | 7/2000 | Altwood et al. |
| 6,136,664 | A | 10/2000 | Economikos et al. |
| 6,150,286 | A | 11/2000 | Sun et al. |
| 6,164,412 | A | 12/2000 | Allman |
| 6,242,368 | B1 | 6/2001 | Holmer et al. |
| 6,251,751 | B1 | 6/2001 | Chu et al. |
| 6,299,753 | B1 | 10/2001 | Chao et al. |
| 6,319,766 | B1 | 11/2001 | Bakli et al. |
| 6,334,266 | B1 | 1/2002 | Moritz et al. |
| 6,368,412 | B1 | 4/2002 | Gomi |
| 6,387,764 | B1 * | 5/2002 | Curtis ............ H01L 21/76224 438/296 |
| 6,442,980 | B2 | 9/2002 | Preston et al. |
| 6,468,490 | B1 | 10/2002 | Shamouilian et al. |
| 6,500,603 | B1 | 12/2002 | Shioda |
| 6,583,497 | B2 | 6/2003 | Xia et al. |
| 6,619,304 | B2 | 9/2003 | Worm |
| 6,797,336 | B2 | 9/2004 | Garvey et al. |
| 6,841,432 | B1 | 1/2005 | Takemura et al. |
| 7,055,333 | B2 | 6/2006 | Leitch et al. |
| 7,084,079 | B2 | 8/2006 | Conti et al. |
| 7,105,061 | B1 | 9/2006 | Shrinivasan et al. |
| 7,111,630 | B2 | 9/2006 | Mizobata et al. |
| 7,114,517 | B2 | 10/2006 | Sund et al. |
| 7,211,525 | B1 | 5/2007 | Shanker et al. |
| 7,282,458 | B2 | 10/2007 | Gates et al. |
| 7,361,231 | B2 | 4/2008 | Fury et al. |
| 7,460,760 | B2 | 12/2008 | Cho et al. |
| 7,491,658 | B2 | 2/2009 | Nguyen et al. |
| 7,503,334 | B1 | 3/2009 | Shrinivasan et al. |
| 7,521,089 | B2 | 4/2009 | Hillman et al. |
| 7,521,378 | B2 | 4/2009 | Fucsko et al. |
| 7,541,297 | B2 | 6/2009 | Mallick et al. |
| 7,576,441 | B2 | 8/2009 | Yin et al. |
| 7,650,965 | B2 | 1/2010 | Thayer et al. |
| 7,651,959 | B2 | 1/2010 | Fukazawa et al. |
| 7,655,532 | B1 | 2/2010 | Chen et al. |
| 7,825,038 | B2 | 11/2010 | Ingle et al. |
| 7,825,042 | B2 | 11/2010 | Mandal |
| 7,867,923 | B2 | 1/2011 | Mallick et al. |
| 7,891,228 | B2 | 2/2011 | Ding et al. |
| 8,027,089 | B2 | 9/2011 | Hayashi |
| 8,306,026 | B2 | 11/2012 | Anjum et al. |
| 8,318,584 | B2 | 11/2012 | Li et al. |
| 8,349,085 | B2 | 1/2013 | Tahara et al. |
| 8,449,942 | B2 | 5/2013 | Li et al. |
| 8,455,368 | B2 | 6/2013 | Chandler et al. |
| 8,466,073 | B2 | 6/2013 | Wang et al. |
| 8,481,123 | B2 | 7/2013 | Kim et al. |
| 8,536,065 | B2 | 9/2013 | Seamons et al. |
| 8,557,712 | B1 | 10/2013 | Antonelli et al. |
| 8,563,445 | B2 | 10/2013 | Liang et al. |
| 8,647,992 | B2 | 2/2014 | Liang et al. |
| 8,668,868 | B2 | 3/2014 | Chiu et al. |
| 8,741,788 | B2 | 6/2014 | Liang et al. |
| 8,871,656 | B2 | 10/2014 | Mallick et al. |
| 8,906,761 | B2 | 12/2014 | Kim et al. |
| 8,936,834 | B2 | 1/2015 | Kim et al. |
| 9,121,515 | B2 | 9/2015 | Yamamoto et al. |
| 9,153,442 | B2 | 10/2015 | Wang et al. |
| 9,157,730 | B2 | 10/2015 | Rajagopalan et al. |
| 9,257,314 | B1 | 2/2016 | Rivera et al. |
| 9,306,026 | B2 | 4/2016 | Toriumi et al. |
| 9,362,107 | B2 | 6/2016 | Thadani et al. |
| 9,382,621 | B2 | 7/2016 | Choi et al. |
| 9,484,406 | B1 | 11/2016 | Sun et al. |
| 9,570,551 | B1 | 2/2017 | Balakrishnan et al. |
| 10,083,834 | B2 | 9/2018 | Thompson et al. |
| 10,096,516 | B1 | 10/2018 | Leschkies et al. |
| 10,179,941 | B1 | 1/2019 | Khan et al. |
| 10,276,411 | B2 | 4/2019 | Delmas et al. |
| 10,529,603 | B2 | 1/2020 | Liang et al. |
| 10,675,581 | B2 | 6/2020 | Khan et al. |
| 10,720,341 | B2 | 7/2020 | Liang et al. |
| 2001/0029108 | A1 | 10/2001 | Tometsuka |
| 2001/0041122 | A1 | 11/2001 | Kroeker |
| 2001/0050096 | A1 | 12/2001 | Costantini et al. |
| 2002/0066535 | A1 | 6/2002 | Brown et al. |
| 2002/0073922 | A1 | 6/2002 | Frankel et al. |
| 2002/0122885 | A1 | 9/2002 | Ahn |
| 2002/0134439 | A1 | 9/2002 | Kawasaki et al. |
| 2002/0148492 | A1 | 10/2002 | Yamagata et al. |
| 2002/0151128 | A1 | 10/2002 | Lane et al. |
| 2002/0155714 | A1 | 10/2002 | Suzuki |
| 2002/0192056 | A1 | 12/2002 | Reimer et al. |
| 2003/0022487 | A1 | 1/2003 | Yoon et al. |
| 2003/0030945 | A1 | 2/2003 | Heinonen et al. |
| 2003/0049372 | A1 | 3/2003 | Cook et al. |
| 2003/0053893 | A1 | 3/2003 | Matsunaga et al. |
| 2003/0101938 | A1 | 6/2003 | Ronsse et al. |
| 2003/0121887 | A1 | 7/2003 | Garvey et al. |
| 2003/0148035 | A1 | 8/2003 | Lingampalli |
| 2003/0148631 | A1 | 8/2003 | Kuo et al. |
| 2003/0194615 | A1 | 10/2003 | Krauth |
| 2003/0207593 | A1 | 11/2003 | Derderian et al. |
| 2003/0232512 | A1 | 12/2003 | Dickinson et al. |
| 2004/0025908 | A1 | 2/2004 | Douglas et al. |
| 2004/0060519 | A1 | 4/2004 | Beauchaine et al. |
| 2004/0074869 | A1 | 4/2004 | Wang et al. |
| 2004/0112409 | A1 | 6/2004 | Schilling |
| 2004/0184792 | A1 | 9/2004 | Hamelin et al. |
| 2004/0219800 | A1 | 11/2004 | Tognetti |
| 2004/0248392 | A1 | 12/2004 | Narwankar et al. |
| 2004/0255979 | A1 | 12/2004 | Fury et al. |
| 2005/0003655 | A1 | 1/2005 | Cathey et al. |
| 2005/0051194 | A1 | 3/2005 | Sakashita et al. |
| 2005/0082281 | A1 | 4/2005 | Uemori et al. |
| 2005/0136684 | A1 | 6/2005 | Mukai et al. |
| 2005/0161158 | A1 | 7/2005 | Schumacher |
| 2005/0191828 | A1 | 9/2005 | Al-Bayati et al. |
| 2005/0198971 | A1 | 9/2005 | Leitch et al. |
| 2005/0250347 | A1 | 11/2005 | Bailey et al. |
| 2005/0269291 | A1 | 12/2005 | Kent |
| 2006/0003596 | A1 | 1/2006 | Fucsko et al. |
| 2006/0035035 | A1 * | 2/2006 | Sakama ............ H01L 21/02422 427/569 |
| 2006/0105107 | A1 | 5/2006 | Lindeboom et al. |
| 2006/0124613 | A1 | 6/2006 | Kumar et al. |
| 2006/0175012 | A1 | 8/2006 | Lee |
| 2006/0207633 | A1 | 9/2006 | Kim et al. |
| 2006/0226117 | A1 | 10/2006 | Bertram et al. |

(56) References Cited

U.S. PATENT DOCUMENTS

| | | |
|---|---|---|
| 2006/0279025 A1 | 12/2006 | Heidari et al. |
| 2006/0290017 A1 | 12/2006 | Yanagisawa |
| 2007/0012402 A1 | 1/2007 | Sneh |
| 2007/0045753 A1 | 3/2007 | Pae et al. |
| 2007/0087533 A1 | 4/2007 | Nishikawa et al. |
| 2007/0187386 A1 | 8/2007 | Kim et al. |
| 2007/0204797 A1 | 9/2007 | Fischer |
| 2007/0212850 A1 | 9/2007 | Ingle et al. |
| 2007/0243317 A1 | 10/2007 | Du Bois et al. |
| 2007/0256559 A1 | 11/2007 | Chen et al. |
| 2008/0074658 A1 | 3/2008 | Davis et al. |
| 2008/0083109 A1 | 4/2008 | Shibata et al. |
| 2008/0115726 A1 | 5/2008 | Ingle et al. |
| 2008/0121882 A1 | 5/2008 | Hwang et al. |
| 2008/0210273 A1 | 9/2008 | Joe |
| 2008/0241384 A1 | 10/2008 | Jeong et al. |
| 2008/0251904 A1 | 10/2008 | Theuss et al. |
| 2008/0268635 A1 | 10/2008 | Yu et al. |
| 2008/0315762 A1 | 12/2008 | Hamada et al. |
| 2009/0018688 A1 | 1/2009 | Chandler et al. |
| 2009/0081884 A1 | 3/2009 | Yokota et al. |
| 2009/0110622 A1 | 4/2009 | Chiu et al. |
| 2009/0148965 A1 | 6/2009 | Kim et al. |
| 2009/0180847 A1 | 7/2009 | Guo et al. |
| 2009/0186481 A1 | 7/2009 | Suzuki et al. |
| 2009/0233449 A1 | 9/2009 | Lebouitz et al. |
| 2009/0243126 A1 | 10/2009 | Washiya et al. |
| 2010/0006211 A1 | 1/2010 | Wolk et al. |
| 2010/0012292 A1 | 1/2010 | Yamazaki |
| 2010/0022068 A1 | 1/2010 | Chen et al. |
| 2010/0072569 A1 | 3/2010 | Han et al. |
| 2010/0173470 A1 | 7/2010 | Lee et al. |
| 2010/0173495 A1 | 7/2010 | Thakur et al. |
| 2010/0196626 A1 | 8/2010 | Choi et al. |
| 2010/0304027 A1 | 12/2010 | Lee et al. |
| 2010/0320459 A1 | 12/2010 | Umeda et al. |
| 2010/0327422 A1 | 12/2010 | Lee et al. |
| 2011/0151677 A1 | 6/2011 | Wang et al. |
| 2011/0165781 A1 | 7/2011 | Liang et al. |
| 2011/0198736 A1 | 8/2011 | Shero et al. |
| 2011/0303147 A1 | 12/2011 | Tachibana |
| 2011/0305836 A1 | 12/2011 | Murata et al. |
| 2012/0048304 A1 | 3/2012 | Kitajima et al. |
| 2012/0056173 A1 | 3/2012 | Pieralisi |
| 2012/0060868 A1 | 3/2012 | Gray |
| 2012/0112224 A1 | 5/2012 | Le Bellac et al. |
| 2012/0142192 A1 | 6/2012 | Li et al. |
| 2012/0142198 A1 | 6/2012 | Wang et al. |
| 2012/0175822 A1 | 7/2012 | Inamiya et al. |
| 2012/0252210 A1 | 10/2012 | Tohnoe |
| 2012/0285492 A1 | 11/2012 | Lee et al. |
| 2012/0304485 A1 | 12/2012 | Hayashi et al. |
| 2013/0194350 A1 | 8/2013 | Watanabe et al. |
| 2013/0233170 A1 | 9/2013 | Spiegelman et al. |
| 2013/0288485 A1 | 10/2013 | Liang et al. |
| 2013/0302916 A1 | 11/2013 | Kim et al. |
| 2013/0330042 A1 | 12/2013 | Nara et al. |
| 2013/0337171 A1 | 12/2013 | Sasagawa |
| 2014/0003892 A1 | 1/2014 | Yamamoto et al. |
| 2014/0023320 A1 | 1/2014 | Lee et al. |
| 2014/0045300 A1 | 2/2014 | Chen et al. |
| 2014/0051264 A1 | 2/2014 | Mallick et al. |
| 2014/0076494 A1 | 3/2014 | Miyashita et al. |
| 2014/0134827 A1 | 5/2014 | Swaminathan et al. |
| 2014/0138802 A1 | 5/2014 | Starostine et al. |
| 2014/0159135 A1 | 6/2014 | Fujimoto et al. |
| 2014/0183743 A1 | 7/2014 | Matsumoto et al. |
| 2014/0231384 A1 | 8/2014 | Underwood et al. |
| 2014/0234583 A1 | 8/2014 | Ryu et al. |
| 2014/0235068 A1 | 8/2014 | Ashihara et al. |
| 2014/0239291 A1 | 8/2014 | Son et al. |
| 2014/0264237 A1 | 9/2014 | Chen et al. |
| 2014/0268080 A1 | 9/2014 | Beasley et al. |
| 2014/0284821 A1 | 9/2014 | Hubbard |
| 2014/0322921 A1 | 10/2014 | Ahmad et al. |
| 2015/0000870 A1 | 1/2015 | Hosotani et al. |
| 2015/0050807 A1 | 2/2015 | Wu et al. |
| 2015/0056819 A1 | 2/2015 | Wong et al. |
| 2015/0091009 A1 | 4/2015 | Yamazaki et al. |
| 2015/0099342 A1 | 4/2015 | Tsai et al. |
| 2015/0159272 A1 | 6/2015 | Yoon et al. |
| 2015/0179501 A1 | 6/2015 | Jhaveri et al. |
| 2015/0197455 A1 | 7/2015 | Pranov |
| 2015/0255581 A1 | 9/2015 | Lin et al. |
| 2015/0292736 A1 | 10/2015 | Hirson et al. |
| 2015/0309073 A1 | 10/2015 | Mirkin et al. |
| 2015/0322286 A1 | 11/2015 | Cabrini et al. |
| 2015/0364348 A1 | 12/2015 | Park et al. |
| 2016/0027887 A1 | 1/2016 | Yuan et al. |
| 2016/0035600 A1 | 2/2016 | Rivera et al. |
| 2016/0064209 A1 | 3/2016 | Lee et al. |
| 2016/0064482 A1 | 3/2016 | Hashemi et al. |
| 2016/0076149 A1 | 3/2016 | Yamazaki et al. |
| 2016/0086831 A1 | 3/2016 | Rivera et al. |
| 2016/0111272 A1 | 4/2016 | Girard et al. |
| 2016/0118391 A1 | 4/2016 | Zhao et al. |
| 2016/0163540 A1 | 6/2016 | Liao et al. |
| 2016/0208414 A1 | 7/2016 | Odawara et al. |
| 2016/0260526 A1 | 9/2016 | Otto |
| 2016/0273758 A1 | 9/2016 | Fujimura |
| 2016/0274454 A1 | 9/2016 | Beasley et al. |
| 2016/0314964 A1 | 10/2016 | Tang et al. |
| 2016/0334162 A1 | 11/2016 | Kim et al. |
| 2016/0336405 A1 | 11/2016 | Sun et al. |
| 2016/0353522 A1 | 12/2016 | Rathi et al. |
| 2017/0005188 A1 | 1/2017 | Cheng et al. |
| 2017/0005204 A1 | 1/2017 | Hosoba et al. |
| 2017/0011932 A1 | 1/2017 | Pethe et al. |
| 2017/0084487 A1 | 3/2017 | Chebiam et al. |
| 2017/0104062 A1 | 4/2017 | Bi et al. |
| 2017/0140996 A1 | 5/2017 | Lin et al. |
| 2017/0160012 A1 | 6/2017 | Kobayashi et al. |
| 2017/0162413 A1 | 6/2017 | Rebstock |
| 2017/0194430 A1 | 7/2017 | Wood et al. |
| 2017/0253968 A1 | 9/2017 | Yahata |
| 2017/0263702 A1 | 9/2017 | Chan et al. |
| 2017/0314125 A1 | 11/2017 | Fenwick et al. |
| 2017/0358483 A1 | 12/2017 | Roy et al. |
| 2018/0019249 A1 | 1/2018 | Zhang et al. |
| 2018/0023192 A1 | 1/2018 | Chandra et al. |
| 2018/0087418 A1 | 3/2018 | Cadigan et al. |
| 2018/0258533 A1* | 9/2018 | Liang .................. C23C 16/52 |
| 2018/0261480 A1 | 9/2018 | Liang et al. |
| 2018/0286674 A1 | 10/2018 | Manna et al. |
| 2018/0315626 A1 | 11/2018 | Franklin |
| 2018/0337027 A1 | 11/2018 | L'Heureux et al. |
| 2018/0342384 A1 | 11/2018 | Wong et al. |
| 2018/0350563 A1 | 12/2018 | Manna et al. |
| 2019/0057879 A1 | 2/2019 | Delmas et al. |
| 2019/0119769 A1 | 4/2019 | Khan et al. |
| 2019/0139793 A1 | 5/2019 | Delmas et al. |
| 2019/0148178 A1 | 5/2019 | Liang et al. |
| 2019/0148186 A1 | 5/2019 | Schaller et al. |
| 2019/0157074 A1 | 5/2019 | Delmas |
| 2019/0198367 A1 | 6/2019 | Liang et al. |
| 2019/0228982 A1 | 7/2019 | Chen et al. |
| 2019/0237345 A1 | 8/2019 | Delmas et al. |
| 2019/0258153 A1 | 8/2019 | Nemani et al. |
| 2019/0259625 A1 | 8/2019 | Nemani et al. |
| 2019/0279879 A1 | 9/2019 | Singh et al. |
| 2019/0311896 A1 | 10/2019 | Balseanu et al. |
| 2019/0368035 A1 | 12/2019 | Malik et al. |
| 2019/0371650 A1 | 12/2019 | Sun et al. |
| 2020/0035509 A1 | 1/2020 | Khan et al. |
| 2020/0035513 A1 | 1/2020 | Khan et al. |
| 2020/0098574 A1 | 3/2020 | Wong et al. |

FOREIGN PATENT DOCUMENTS

| | | |
|---|---|---|
| CN | 104089491 A | 10/2014 |
| EP | 1107288 A2 | 6/2001 |
| GN | 1280875 C | 10/2006 |
| JP | S63-004616 | 1/1988 |
| JP | H1218018 A | 8/1989 |

(56) References Cited

FOREIGN PATENT DOCUMENTS

| | | |
|---|---|---|
| JP | 06-283496 | 10/1994 |
| JP | H07048489 A | 5/1995 |
| JP | H08195493 A | 7/1996 |
| JP | H9296267 A | 11/1997 |
| JP | H10214880 A | 8/1998 |
| JP | H10335657 A | 12/1998 |
| JP | 2001110729 A | 4/2001 |
| JP | 2003-51474 A | 2/2003 |
| JP | 2003166065 A | 6/2003 |
| JP | 2003188387 A | 7/2003 |
| JP | 2004127958 A | 4/2004 |
| JP | 2005064269 A | 3/2005 |
| JP | 2005-333015 A | 12/2005 |
| JP | 2006526125 A | 11/2006 |
| JP | 2007242791 A | 9/2007 |
| JP | 2008/073611 A | 4/2008 |
| JP | 2008153635 A | 7/2008 |
| JP | 2009-129927 A | 6/2009 |
| JP | 2009-539231 A | 11/2009 |
| JP | 2010-205854 A | 9/2010 |
| JP | 2012-503883 A | 2/2012 |
| JP | 2012-204656 A | 10/2012 |
| JP | 2013-105777 A | 5/2013 |
| JP | 2013516788 A | 5/2013 |
| JP | 2013-179244 A | 9/2013 |
| JP | 2014019912 A | 2/2014 |
| KR | 19980063671 A | 10/1998 |
| KR | 20030052162 A | 6/2003 |
| KR | 100422433 B1 | 7/2004 |
| KR | 20050121750 A | 12/2005 |
| KR | 20070075383 A | 7/2007 |
| KR | 20090011463 A | 2/2009 |
| KR | 1020090040867 A | 4/2009 |
| KR | 10-2009-0064279 A | 6/2009 |
| KR | 10-2010-0035000 A | 4/2010 |
| KR | 20110136532 A | 12/2011 |
| KR | 101287035 B1 | 7/2013 |
| KR | 101305904 B1 | 9/2013 |
| KR | 20140003776 A | 1/2014 |
| KR | 20140135744 A | 11/2014 |
| KR | 20150006587 A | 1/2015 |
| KR | 20150122432 A | 11/2015 |
| TW | 200529284 A | 9/2005 |
| TW | 200721316 A | 6/2007 |
| TW | 201507174 A | 2/2015 |
| TW | 201608672 A | 3/2016 |
| TW | 201708597 A | 3/2017 |
| WO | 2004102055 A1 | 11/2004 |
| WO | 2005057663 A2 | 6/2005 |
| WO | 2008047886 A1 | 4/2008 |
| WO | 2008/089178 A | 7/2008 |
| WO | 2011/103062 A2 | 8/2011 |
| WO | 2012/133583 A1 | 10/2012 |
| WO | 2016/018593 A1 | 2/2016 |
| WO | 2016018593 A1 | 2/2016 |
| WO | 2016065219 A | 4/2016 |

OTHER PUBLICATIONS

International Search Report and Written Opinion from PCT/US2018/034036 dated Aug. 24, 2018.
International Search Report and Written Opinion dated Aug. 24, 2018 for Application No. PCT/US2018/034284.
International Search Report, Application No. PCT/US2018/028258 dated Aug. 9, 2018.
International Search Report and Written Opinion for PCT/US2018/035210 dated Aug. 24, 2018.
International Search Report and Written Opinion for PCT/US2018/037539 dated Oct. 5, 2018.
International Search Report and Written Opinion for PCT/US2018/038822 dated Oct. 26, 2018.
Chen, Yang et al., "Analysis of Supercritical Carbon Dioxide Heat Exchangers in Cooling Process", International Refrigeration and Air Conditioning Conference at Purdue, Jul. 17-20, 2006, pp. 1-8.
Shimoyama, Takehiro et al., "Porous Aluminum for Heat Exchanger", Hitachi Chemical, pp. 19-20.
Kato, T et al., "Heat Transfer Characteristics of a Plate-Fin Type Superoritical/Liquid Helium Heat Exchanger", ICEC 14 Proceedings Supplement, 1992, pp. 260-263.
Lee, Ho-Saeng et al., "The cooling heat transfer characteristics of the supercritical CO2 in mico-fin tube", Springer, Oct. 2, 2012, pp. 173-184.
International Search Report and Written Opinion dated Nov. 30, 2018 for Application No. PCT/US2018/041688.
International Search Report and Written Opinion for PCT/US2018/043160 dated Jan. 31, 2019.
International Search Report and Written Opinion dated Jan. 31, 2019 for Application No. PCT/US2018/042760.
International Search Report and Written Opinion for PCT/US2018/059643 dated Feb. 26, 2019.
International Search Report and Written Opinion from PCT/US2019/012161 dated Apr. 30, 2019.
International Search Report and Written Opinion for PCT/US2019/015339 dated May 15, 2 019.
International Search Report and Written Opinion for PCT/US2019/015332 dated May 15, 2 019.
International Search Report and Written Opinion for PCT/US2018/059676 dated May 23, 2019.
International Search Report and Written Opinion for PCT/US2019/023431 dated Jul. 5, 2019.
Haskel Pressure on Demand, Pneumatic and Hydraulic Driven Gas Boosters, Apr. 30, 2016, 36 pp.
Taiwan Office Action dated Jul. 3, 2019 for Application No. 107136151.
International Search Report and Written Opinion for International Application No. PCT/US2019/029602 dated Aug. 14, 2019.
Taiwan Office Action dated Jun. 11, 2019 for Application No. 107138905.
Office Action for Japanese Application No. 2018-546484 dated Oct. 8, 2019.
International Search Report and Written Opinion for International Application No. PCT/US2019/040195 dated Oct. 25, 2019.
Taiwan Office Action dated Nov. 19, 2019 for Application No. 108103415.
Office Action for Japanese Application No. 2018-517285 dated Oct. 23, 2019.
Office Action for Taiwan Patent Application No. 108111501 dated Nov. 14, 2019.
Taiwan Office Action dated Oct. 12, 2020 for Application No. 108140559.
Office Action from Taiwan Patent Application No. 108104585 dated Jan. 30, 2020, with concise statement of relevance.
Pedestal definition from Dictionary.com, printed on Feb. 10, 2020 (year 2020).
International Search Report and Written Opinion for PCT/US2018/050464 dated Jan. 4, 2019.
International Search Report and Written Opinion for PCT/US2019/056447 dated Feb. 7, 2020.
KR Office Action dated Feb. 4, 2020 for Application No. 10-2018-0133399.
Taiwan Office Action dated Feb. 21, 2020 for Application No. 108138212.
Taiwan Search Report dated Feb. 21, 2020 for Application No. 108138212.
International Search Report and Written Opinion for International Application No. PCT/US2019/059659 dated Feb. 26, 2020.
Office Action for Japanese Application No. 2019-548976 dated Oct. 20. 2020.
European Interational Search Report issued to 18764622.9 dated Nov. 20, 2020.
Office Action for Korean Application No. 10-2019-7029776 dated Jan. 18, 2021.
International Search Report and Written Opinion dated Jan. 31, 2019 for Application No. PCT/US2018/043160.
Japanese Office Action dated Feb. 16, 2021 for Application No. 2019-564964.

(56) References Cited

OTHER PUBLICATIONS

Extended European international Search Report issued to 18831823.2 dated Mar. 19, 2021.

* cited by examiner

FILM DEPOSITION USING ENHANCED DIFFUSION PROCESS

CROSS-REFERENCE TO RELATED APPLICATIONS

This application claims priority to U.S. Provisional Patent Application No. 62/768,523, filed Nov. 16, 2018, the entirety of which is herein incorporated by reference.

BACKGROUND

Field

Embodiments of the present disclosure generally relate to semiconductor manufacturing processes, and more particularly, to methods for gapfilling features of semiconductor devices.

Description of the Related Art

For many semiconductor device manufacturing processes there is a need to fill features of the semiconductor device. Conventionally, chemical vapor deposition (CVD) under a sub-atmospheric pressure is utilized. However, the deposition rate at a sub-atmospheric pressure forms seams between the features because of the uneven deposition rates. The seams are further opened up during post-curing processes and ultimately cause decreased throughput or even semiconductor device failure. Therefore, there is a need for methods for gapfilling and seam healing features of semiconductor devices that can provide seam-free film growth.

SUMMARY

In one embodiment, a method for filling features on a substrate is provided. The method includes positioning a substrate having one or more features formed in a surface of a material formed on the substrate in a process chamber, exposing the one or more features to at least one precursor at a pressure of about 1 bar or greater, and forming a gap fill layer over the one or more features to fill the one or more features, wherein the gap fill layer comprises at least one of a silicon-containing film or a carbon-containing gap fill layer.

In another embodiment, a method for filling features on a substrate is provided. The method includes positioning a substrate having one or more features formed in a surface of a material disposed on the substrate in a process chamber. At least one of the one or more features includes a material disposed over the one or more features and a seam disposed in the material. The material is exposed to at least one precursor at a pressure of about 1 bar or greater. The seam is filled with a filling material formed from the at least one precursor, the seam filling including at least one of a silicon containing seam filling layer or a carbon containing seam filling layer.

In yet another embodiment, a method for filling features formed on a substrate is provided. The method includes flowing a precursor containing at least one of silicon or carbon into a processing region of a processing chamber containing a substrate. The pressure of the precursor disposed within the processing region containing the substrate is maintained at about 1 bar or greater. A feature or seam that is disposed on the substrate, which is disposed within the processing region containing the precursor is gapfilled or healed respectively.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
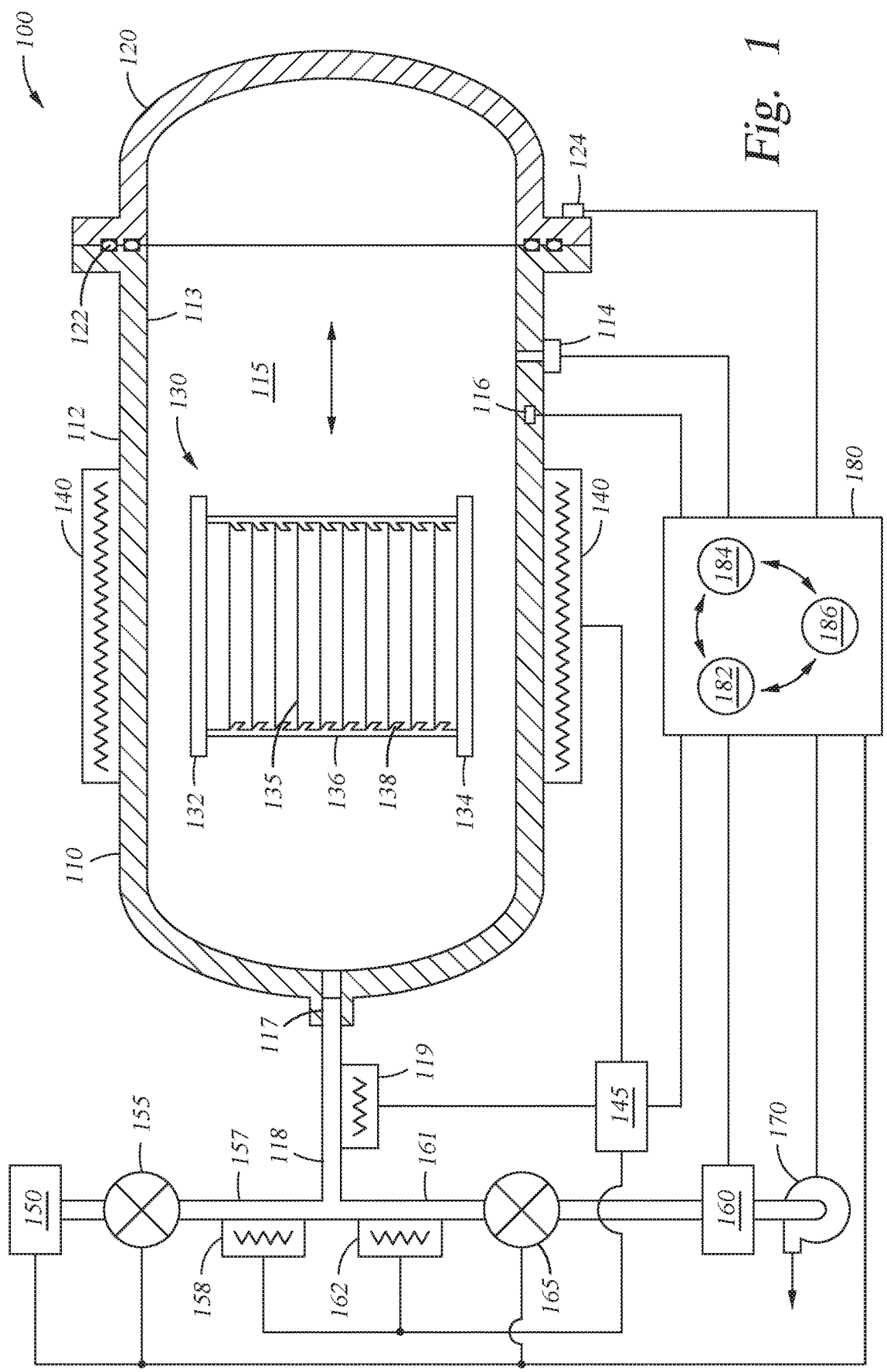
FIG. 1 is a front, cross-sectional view of a chamber according to an embodiment.

Embodiments described herein include methods of seam-free gapfilling and seam healing. Embodiments described herein will be described below in reference to methods of seam-free gapfilling and seam healing that can be carried out using a chamber operable to maintain a supra-atmospheric pressure (e.g., a pressure greater than atmospheric pressure). The supra-atmospheric pressure process advantageously allows for seams within a previously deposited material to be filled or healed. The supra-atmospheric pressure process described herein additionally provides a method for seam-free gapfilling, wherein structures are filled, without the formation of seams, and film conformity is improved. The substantially seam-free or seam healed material can then be utilized to produce more robust and better performing electronic devices. The apparatus description described herein is illustrative, and should not be construed or interpreted as limiting the scope of the implementations described herein.

FIG. 1a is simplified front cross-sectional view of a chamber 100 suitable for performing the methods of seam-free gapfilling and seam healing described herein. It is contemplated that the methods of seam-fee gapfilling and seam healing described herein may alternatively be practiced in other chambers. The chamber 100 has a body 110 with an outer surface 112 and an inner surface 113 that encloses a processing region 115. The chamber 100 has a door 120 configured to sealably enclose the processing region 115 within the body 110 such that the processing region 115 can be accessed when the door 120 is open. A supra-atmospheric seal 122 is utilized to seal the door 120 to the body 110 in order to seal the processing region 115 for processing.

The chamber 100 has a port 117 through the body 110. The port 117 has a pipe 118 therethrough, which is coupled to a heater 119. One end of the pipe 118 is connected to the processing region 115. The other end of the pipe 118 bifurcates into an inlet conduit 157 and an outlet conduit 161. The inlet conduit 157 is fluidly connected to a gas panel 150 via an isolation valve 155. The inlet conduit 157 is coupled to a heater 158. The outlet conduit 161 is fluidly connected to a condenser 160 via an isolation valve 165. The outlet conduit 161 is coupled to a heater 162. The heaters 119, 158 and 162 are configured to maintain a processing gas flowing through the pipe 118, inlet conduit 157 and the outlet conduit 161 respectively at a temperature above the condensation point, such that the processing gas does not condense to form a liquid. The temperature of the processing gas flowing through the pipe 118, inlet conduit 157, and the outlet conduit 161 is kept at a temperature that is above the condensation point, but does not compromise the structural integrity of the chamber by increasing the pressure above a predetermined limit. The predetermined pressure limit can be 25 bar or higher, such as 50 bar or higher, or 100 bar or higher. In one embodiment, the temperature is between the condensation point of the processing gas and about 250 degrees Celsius. In another embodiment, the temperature is kept between the condensation point of the processing gas and about 350 degrees Celsius. In another embodiment, the temperature is kept at any temperature above the condensation point of the processing gas, as long as the pressure within the processing chamber that is caused by the temperature increase, does not pass a predetermined pressure load threshold. The heaters 119, 158 and 162 are powered by a power source 145.

The gas panel 150 is configured to provide a processing gas under pressure into the inlet conduit 157 for transmission into the processing region 115 through the pipe 118. The pressure of the processing gas introduced into the processing region 115 is monitored by a pressure sensor 114 coupled to the body 110. The condenser 160 is fluidly coupled to a cooling fluid and configured to condense a gaseous product flowing through the outlet conduit 161 after removal from the processing region 115 through the pipe 118. The condenser 160 converts the gaseous products from the gas phase into liquid phase. A pump 170 is fluidly connected to the condenser 160 and pumps out the liquefied products from the condenser 160. The operation of the gas panel 150, the condenser 160 and the pump 170 are controlled by the controller 180.

The isolation valves 155 and 165 are configured to allow only one fluid to flow through the pipe 118 into the processing region 115 at a time. When the isolation valve 155 is open, the isolation valve 165 is closed such that a processing gas flowing through inlet conduit 157 enters into the processing region 115, preventing the flow of the processing gas into the condenser 160. On the other hand, when the isolation valve 165 is open, the isolation valve 155 is closed such that a gaseous product is removed from the processing region 115 and flows through the outlet conduit 161, preventing the flow of the gaseous product into the gas panel 150.

One or more heaters 140 are disposed on the body 110 and configured to heat the processing region 115 within the chamber 100. The heaters 140 are powered by the power source 145. Power to the heaters 140 is controlled by the controller 180 through feedback received from the temperature sensor 116. The temperature sensor 116 is coupled to the body 110 and monitors the temperature of the processing region 115.

A cassette 130 coupled to an actuator (not shown) is moved in and out of the processing region 115. The cassette 130 has a top surface 132, a bottom surface 134, and a wall 136. The wall 136 of the cassette 130 has a plurality of substrate storage slots 138. Each substrate storage slot 138 is evenly spaced along the wall 136 of the cassette 130. Each substrate storage slot 138 is configured to hold a substrate 135 therein. The cassette 130 may have as many as fifty substrate storage slots 138 for holding the substrates 135. The cassette 130 provides an effective vehicle both for transferring a plurality of substrates 135 into and out of the chamber 100 and for processing the plurality of substrates 135 in the processing region 115. Although the chamber 100 described in FIG. 1 is configured to process a plurality of substrates as a batch, the chamber 100 may alternatively be configured to process a single substrate one at a time within the chamber 100.

The controller 180 controls the operation of the chamber 100. The controller 180 controls the operation of the gas panel 150, the condenser 160, the pump 170, the isolation valve 155 and the isolation valve 165 as well as the power source 145. The controller 180 is also communicatively connected to the temperature sensor 116, the pressure sensor 114 and the cooling channel 124. The controller 180 includes a central processing unit (CPU) 182, a memory 184, and a support circuit 186. The CPU 182 may be any form of a general-purpose computer processor that may be used in an industrial setting. The memory 184 may be a random access memory, a read-only memory, a floppy, or a hard disk drive, or other form of digital storage. The support circuit 186 is conventionally coupled to the CPU 182 and may include cache, clock circuits, input/output systems, power supplies, and the like.

The chamber 100 provides a supra-atmospheric pressure for methods of seam-free gapfilling and seam healing. The methods utilize chemical vapor deposition (CVD) under a supra-atmospheric pressure provided via the chamber 100. The supra-atmospheric pressure is maintained in the chamber 100 while exposing at least one substrate 135 to the processing gases in the processing region 115 maintained within a range of about 1 bar to about 100 bar, such as about 1 bar to about 50 bar, such as about 1 bar to about 20 bar, for example about 5 bar to about 15 bar. In another example, the pressure within the process chamber is maintained within a range of about 12 bar to about 50 bar, such as about 12 bar to about 20 bar, for example about 12 bar to about 15 bar. The application of supra-atmospheric pressure in the presence of the processing gases during CVD facilitates seam-free gapfilling and seam healing. In one embodiment, the chamber 100 maintains the processing region 115 and the substrate 135 at a temperature within a range of about 150 degrees Celsius to of about 800 degrees Celsius. In one embodiment, a temperature of the substrate 135 and a temperature of the processing region 115 are different.

Figure 2:
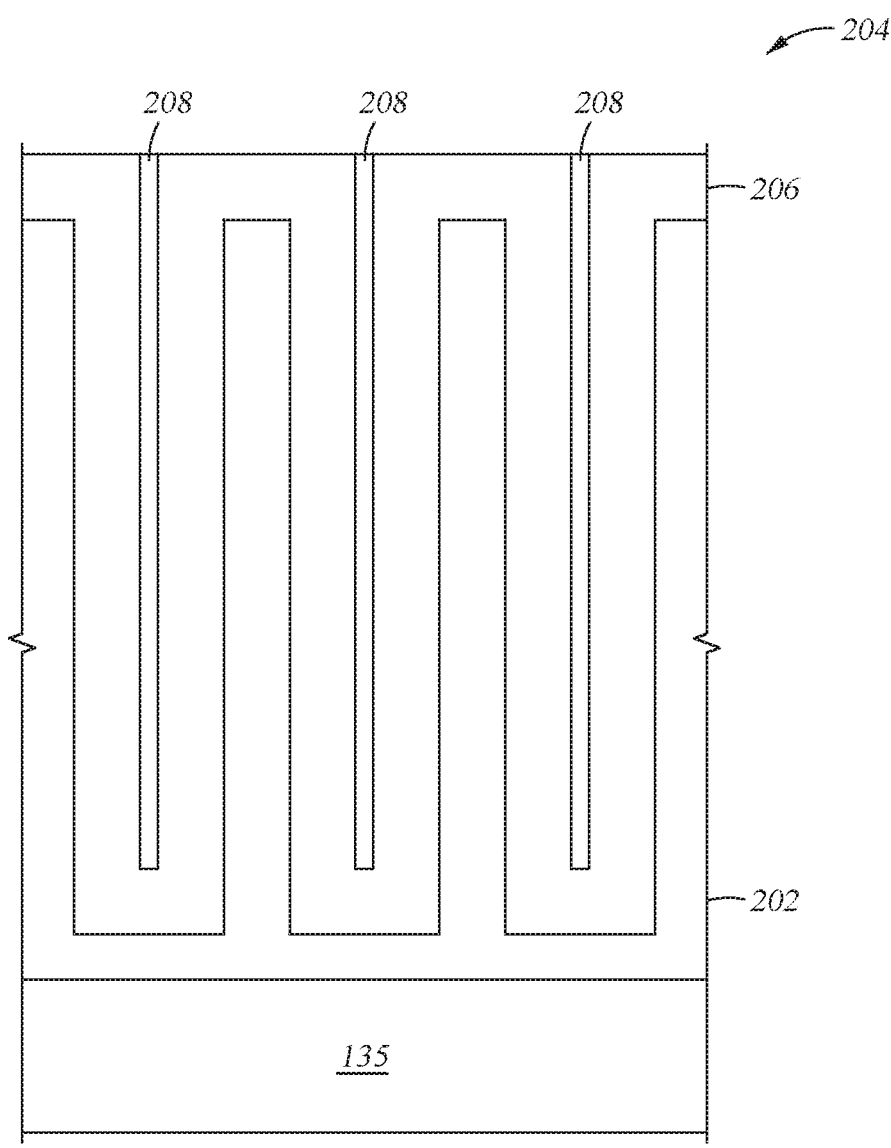
FIG. 2 is a schematic, cross-sectional view of a substrate illustrating seams in a material layer conventionally disposed in features of a substrate according to an embodiment.

FIG. 2 is a schematic, cross-sectional view of a substrate having a material deposited over one or more features of the substrate to fill the one or more features. A substrate 135 includes one or more features 204 (shown as three high aspect ratio trenches) formed in a layer 202, such as a silicon or carbon-containing layer, on the substrate 135. The substrate 135 is generally any suitable substrate for processing, including but not limited to, silicon (Si) and/or germanium (Ge) substrates, and may include other elements such as, oxygen (O), nitrogen (N), and carbon (C). A material 206 is conventionally deposited over the one or more features 204. Examples of the conventional deposition processes include, but are not limited to, chemical vapor deposition (CVD), plasma-enhanced CVD (PECVD), atomic layer deposition (ALD), and plasma-enhanced ALD (PEALD). However, the conventional processes result in one or more seams 208 formed in the one or more features 204 during the deposition of the material 206. The one or more seams 208 can also be described as small gaps or voids within the material 206 that are caused by in-complete filling of a trench or similar feature during gap-fill deposition. Stated differently, a seam 208 is not a purposefully formed trench or similar purposefully formed feature. The one or more seams 208 are exposed to the surface of the material 206, such that at least one end of the seam 208 is exposed to the processing region 115. The seams 208 can be thin seams down the middle of the features 204 formed in the layer 202 and can be of varying depths and thicknesses. In another embodiment, the seams 208 can be formed in only certain features 204, such that not all features 204 have a seam 208. The seams 208 can be off-center within the features and can include a variety of shapes and sizes. If left untreated, the one or more seams 208 often open up during further processing of the substrate 135, which leads to defective device performance.

Figure 3:
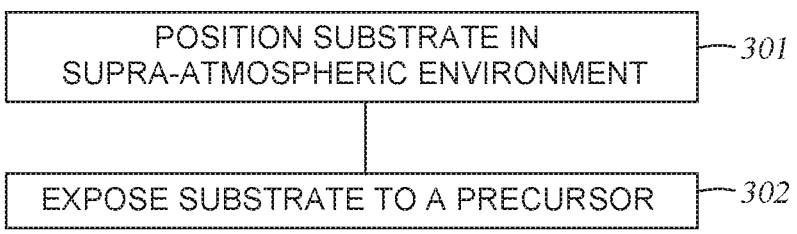
FIG. 3 is a flow diagram of a method for gapfilling features of a substrate according to an embodiment.
Figure 4A:
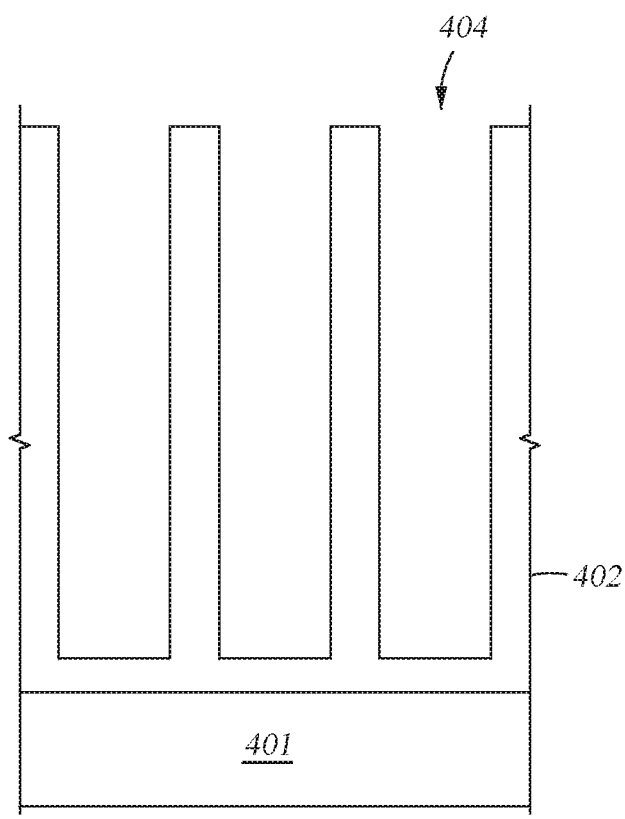
FIG. 4A and FIG. 4B are schematic, cross-sectional views of a substrate in accordance with a method for gapfilling features of a substrate according to an embodiment.
Figure 4B:
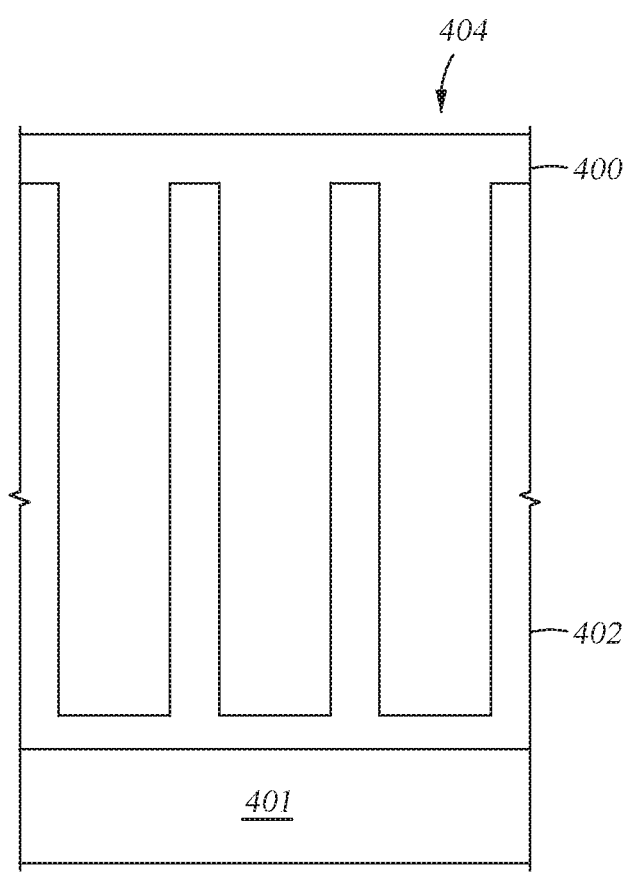

FIG. 3 is a flow diagram of a method 300 for gapfilling features of a substrate. To facilitate explanation, FIG. 3 will be described with reference to FIG. 1, FIG. 4A, and FIG. 4B. However, it is to be noted that a chamber other than chamber 100 of FIG. 1 may be utilized in conjunction with the method 300. FIG. 4A and FIG. 4B are schematic, cross-sectional views of a substrate in accordance with the method 300.

At operation 301, the substrate 401 is positioned in an environment, such as a chamber, for processing. In one example, a plurality of substrates 401 are positioned as a batch for processing in the chamber 100. As shown in FIG. 4A, the substrate 401 has the one or more features 404 (shown as three high aspect ratio trenches) formed in the layer 402, such as a silicon or carbon-containing layer, on the substrate 401. In one embodiment, a plurality of substrates 401, loaded on the cassette 130, are transferred into the processing region 115 of the chamber 100. The door 120 is then closed to seal the chamber 100. The processing region 115 of the chamber 100 is pumped and purged with a non-reactive gas. After purging the processing region, the pressure is increased to slightly above 1 atm absolute pressure, such as about 1 atm to about 2 atm, such as about 1 atm to about 1.5 atm or about 1 atm to about 1.1 atm. The processing region 115 of the chamber 100 is pressurized to turn the chamber 100 into a supra-atmospheric chamber for gapfilling the one or more features 404. In one embodiment, the precursor is heated to a predetermined temperature within the inlet conduit 157 and the pipe 118 before entering the chamber. The chamber may be relatively cool, such that the temperature of the chamber is approximately the same temperature as the precursor heated within the conduit 157 and the pipe 118. In this embodiment, the chamber is heated after the introduction of the precursor, such that a pressure increase is caused by the temperature increase, until the chamber reaches a predetermined processing temperature. In another embodiment, the precursor is introduced into a pre-heated chamber that is already at the processing temperature. In this embodiment, the pressure increase is at least partially attributed to the introduction and heating of the precursor gas within the chamber.

At operation 302, the substrate is exposed to a precursor and a gap fill layer 400 is deposited over the one or more features 404 of the substrate 401 to fill the one or more features 404, as shown in FIG. 4B. The gap fill layer 400 is deposited by CVD at supra-atmospheric pressure. In one embodiment, the supra-atmospheric pressure is within a range of about 1 bar to about 50 bar, such as about 1 bar to about 20 bar, for example about 5 bar to about 15 bar. In another example, the supra-atmospheric pressure within the process chamber is maintained within a range of about 12 bar to about 50 bar, such as about 12 bar to about 20 bar, for example about 12 bar to about 15 bar. In one embodiment, at least one precursor is introduced into the processing region 115 of the chamber 100 at the supra-atmospheric pressure. In some embodiments, at least one precursor can be introduced into the processing region 115 of the chamber 100 at about atmospheric pressure and the pressure increases to obtain a predetermined process chamber pressure. As shown in FIG. 4B, the gap fill layer 400 is deposited over the one or more features 404 of the substrate 401 to fill the one or more features 404 without one or more seams (as shown as reference numeral 208 in the layer 202 illustrated in FIG. 2) formed in the one or more features 404. The gap fill layer 400 deposited without one or more seams 208 leads to improved device performance.

In one embodiment, the gap fill layer 400 is an X material-containing film and the depositing the gap fill layer 400 includes exposing the one or more features 404 of the substrate 401 to an X material-containing precursor, wherein X is an element. Suitable examples of X are, but are not limited to, silicon and carbon, among others. The X material-containing precursor may optionally be heated prior to or while disposed within the chamber 100.

In one embodiment, the gap fill layer 400 is a silicon-containing film and the depositing the gap fill layer 400 includes exposing the one or more features 404 of the substrate 401 to at least one silicon-containing precursor. Examples of suitable silicon-containing precursors include, but are not limited to, one or more of silane ($SiH_4$), disilane ($H_6Si_2$), dichlorosilane (DCS), trisilane ($HsSi_3$), tetrasilane ($Si_4H_{10}$), tetraethyl orthosilicate ($Si(OC_2H_5)_4$), trimethylamine (TMA), dimethylsilane ($C_2H_8Si$), tetramethyldisilane ($((CH_3)_2SiHSiH(CH_3)_2)$), hexamethyldisilane ($(Si(CH_3)_3)_2$), hexamethyldisiloxane (HMDSO), and trisilyl-pentane ($C_8H_{19}NSi$). In one embodiment, the at least one silicon-containing precursor is optionally heated via components of the chamber 100.

In another embodiment, the gap fill layer 400 is a carbon-containing film and the depositing the gap fill layer 400 includes exposing the one or more features 404 of the substrate 401 to at least one carbon-containing precursor. Examples of suitable carbon-containing precursors include, but are not limited to, one or more of methane ($CH_4$), acetylene ($C_2H_2$), propene ($C_3H_6$), tetraethyl orthosilicate ($Si(OC_2H_5)_4$), trimethylamine (TMA), dimethylsilane ($C_2H_8Si$), tetramethyldisilane ($((CH_3)_2SiHSiH(CH_3)_2)$), hexamethyldisilane ($(Si(CH_3)_3)_2$), hexamethyldisiloxane (HMDSO), trisilyl-pentane ($C_8H_{19}NSi$), other alkenes, and other vinyl hydrocarbons. In one embodiment, the at least one carbon-containing precursor is optionally heated via components of the chamber 100.

Depositing the gap fill layer 400 over the one or more features 404 of the substrate 401 occurs at a temperature in the processing region 115 between about 150 degrees Celsius (° C.) and about 450° C. and a temperature of the substrate 401 between about 200° C. and about 800° C. In one embodiment, the one or more features 404 are exposed for a duration of about 1 minute to about 180 minutes. The at least one silicon-containing precursor is provided at a flow rate of about 100 sccm to about 2000 sccm. The at least one carbon-containing precursor is provided at a flow rate of about 100 sccm to about 2000 sccm. In one embodiment, a temperature of 300-400° C. and a supra-atmospheric pressure of about 1 to about 10 bar will result in a gapfill layer 400 that is a conformal film, as shown in FIG. 4B. In another embodiment, a temperature of 500-800° C. and a supra-atmospheric pressure of about 1 bar to about 10 bar will result in a gapfill layer 400 that is non-conformal, such as a bottom-up deposited film. In some embodiments the gap fill layer 400 may be a low hydrogen containing film. In some embodiments the gap fill layer 400 may be a film with substantially no hydrogen concentration within the film. In some embodiments, the gap fill layer 400 constitutes an amorphous silicon film. In some embodiments, the seam filling layer 600 constitutes an amorphous carbon film. In some embodiments, the seam filling layer 600 comprises at least one of a silicon containing gap fill layer or a carbon containing gap fill layer.

Figure 5:
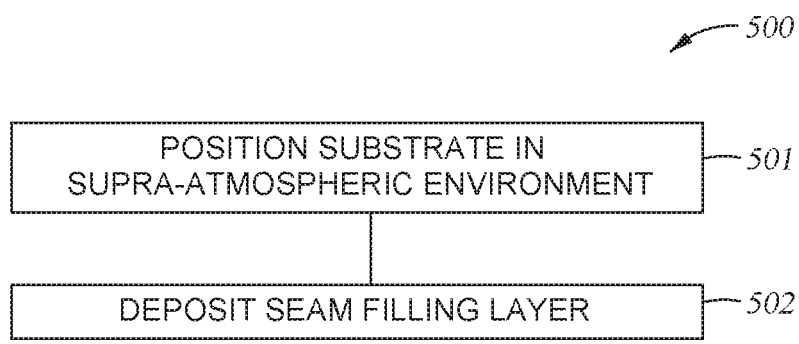
FIG. 5 is a flow diagram of a method for filling seams of a material disposed over one or more features of a substrate according to an embodiment.
Figure 6:
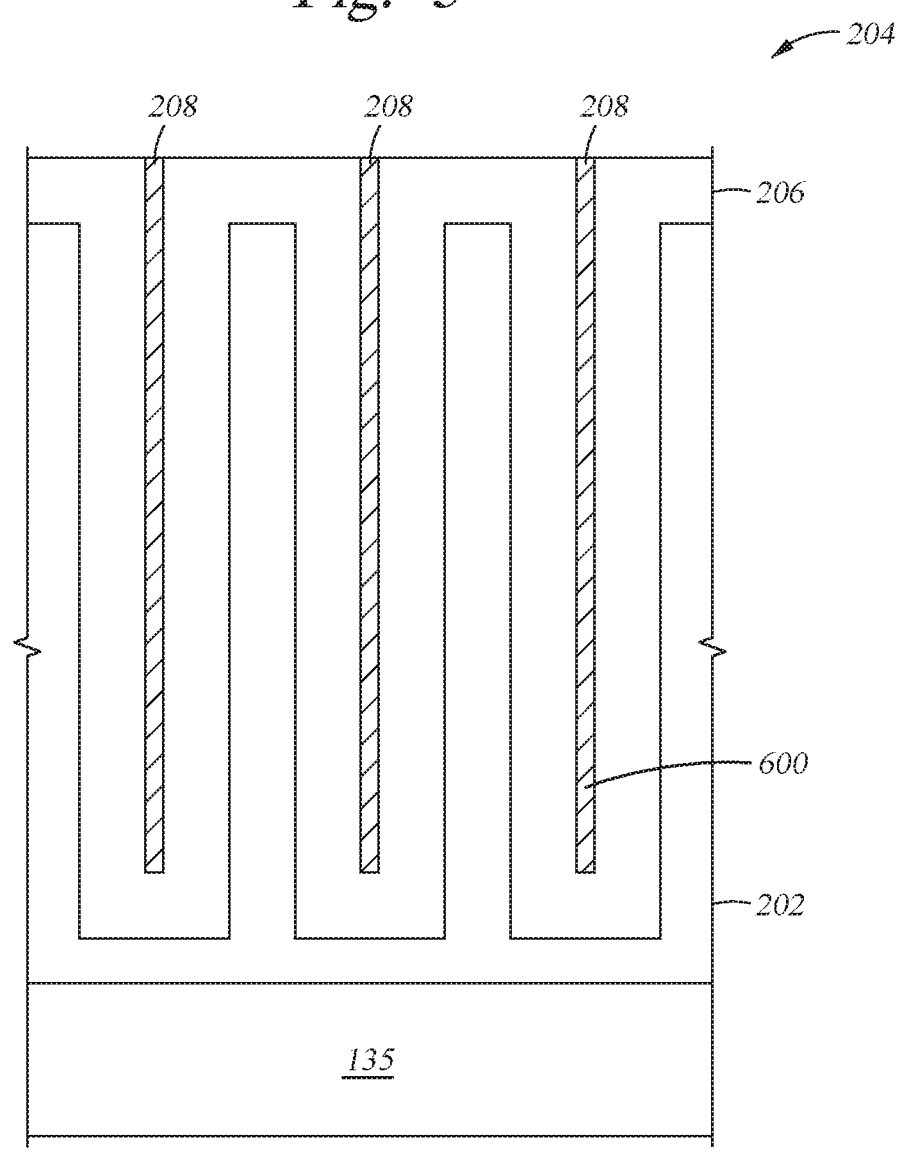
FIG. 6 is a schematic, cross-sectional view of a substrate in accordance with a method for filling seams of a material disposed over one or more features of a substrate according to an embodiment.

FIG. 5 is a flow diagram of a method 500 for filling seams of a material disposed over one or more features of a substrate. To facilitate explanation, FIG. 5 will be described with reference to FIG. 1, FIG. 2, and FIG. 6. However, it is to be noted that a chamber other than chamber 100 of FIG. 1 may be utilized in conjunction with method 500. FIG. 6 is a schematic, cross-sectional view of a substrate in accordance with the method 500.

At operation 501, the substrate 135 is provided into a position or environment, such as a chamber, for processing. In one example, a plurality of substrates 135 are positioned as a batch for processing in the chamber 100. In another example, one substrate 135 is processed in the chamber 100 at a time. As shown in FIG. 2, the substrate 135 has one or more seams 208 of a material 206. Stated differently, the material 206 disposed on the substrate 135 includes one or more seams 208. The material 206 is disposed over one of more features 204 formed in the layer 202 of the substrate 135. In one embodiment, substrates 135 are loaded on the cassette 130 into the processing region 115 of the chamber 100. The door 120 is then closed to seal the chamber 100. The processing region 115 of the chamber 100 is pressurized to turn the chamber 100 into a supra-atmospheric chamber for filling seams 208 of a material 206.

At operation 502, a seam filling layer 600 is deposited in the one or more seams 208 of the substrate 135 to fill the one or more seams 208, as shown in FIG. 6. The seam filling layer 600 is deposited by CVD at supra-atmospheric pressure. Suitable precursors are used at a supra-atmospheric pressure and driven into the seams 208 within the one or more features 204, so that the precursors are driven into the low-pressure seams. This helps enable the precursors to enter the seams 208 to form the seam filling layer 600 within, and thus heal, the seams 208. Seam filling layer 600 is formed within seams that are exposed to the surface of the material 206. In one embodiment, the supra-atmospheric pressure is within a range of about 1 bar to about 50 bar, such as about 1 bar to about 20 bar, for example about 5 bar to about 15 bar. In another example, the pressure within the process chamber is maintained within a range of about 12 bar to about 50 bar, such as about 12 bar to about 20 bar, for example about 12 bar to about 15 bar. In one embodiment, at least one precursor is introduced the processing region 115 of the chamber 100 at the supra-atmospheric pressure. As shown in FIG. 6, the seam filling layer 600 is deposited within the one or more seams 208 to fill the one or more seams 208 without additional seams forming in the seams 208. The use of high pressure, such as described herein, acts as a driving force and allows for the seam filling layer 600 to fill the seams 208. In some embodiments it is contemplated that filling the seams 208 with the seam filling layer 600 will also cause some of the seam filling layer 600 to be deposited on the material 206, outside of the seams 208 and on top of the material 206. This section of the seam filling layer 600 can be later removed via other substrate processing methods, such as chemical mechanical polishing or a selective etch back.

In one embodiment, the material 206 is an X containing film and the depositing the seam filling layer 600 includes exposing the one or more seams 208 of the substrate 135 to an X containing precursor, wherein X is an element. Suitable examples of X are, but are not limited to, silicon and carbon, among others. The X containing precursor may optionally be heated prior to or while disposed within the chamber 100. The X containing film may be similar to the material 206 or the gap filling layer 400. The X containing film may also be created by the reaction of the X containing precursor with the material 206.

In one embodiment, the material 206 contains silicon and the depositing the seam filling layer 600 includes exposing the one or more seams 208 to at least one silicon-containing precursor. The seam filling layer 600 may be a silicon containing layer formed from the silicon-containing precursor. Examples of suitable silicon-containing precursors include, but are not limited to, one or more of silane ($SiH_4$), disilane ($H_6Si_2$), dichlorosilane (DCS), trisilane ($H_8Si_3$), tetrasilane ($Si_4H_{10}$), tetraethyl orthosilicate ($Si(OC_2H_5)_4$), trimethylamine (TMA), dimethylsilane ($C_2H_8Si$), tetramethyldisilane ((($CH_3)_2SiHSiH(CH_3)_2$), hexamethyldisilane (($Si(CH_3)_3)_2$), hexamethyldisiloxane (HMDSO), and trisilyl-pentane ($C_8H_{19}NSi$). In one embodiment, the at least one silicon-containing precursor is optionally heated via components of the chamber 100.

In another embodiment, the material 206 contains carbon and depositing the seam filling layer 600 includes exposing the one or more seams 208 to at least to at least one carbon-containing precursor to form a carbon containing seam filling layer 600. Examples of suitable carbon-containing precursors include, but are not limited to, one or more of methane ($CH_4$), acetylene ($C_2H_2$), propene ($C_3H_6$), tetraethyl orthosilicate ($Si(OC_2H_5)_4$), trimethylamine (TMA), dimethylsilane ($C_2H_8Si$), tetramethyldisilane ((($CH_3)_2SiHSiH(CH_3)_2$), hexamethyldisilane (($Si(CH_3)_3)_2$), hexamethyldisiloxane (HMDSO), trisilyl-pentane ($C_8H_{19}NSi$), other alkenes, and other vinyl hydrocarbons. In one embodiment, the at least one carbon-containing precursor is optionally heated via components of the chamber 100.

In some embodiments, healing the seam 208 comprises depositing a seam filling layer 600 into the seam 208, such that the seam 208 is filled with the seam filling layer 600. Depositing the seam filling layer 600 occurs at a temperature in the processing region 115 between about 150° C. and about 450° C. and a temperature of the substrate 135 between about 200° C. and about 800° C. In one embodiment, the one or more seams 208 are exposed for a duration of about 1 minute to about 60 minutes. The at least one silicon-containing precursor is provided at a flow rate of about 50 sccm to about 1000 sccm. The at least one carbon-containing precursor is provided at a flow rate of about 50 sccm to about 1000 sccm. In some embodiments the seam filling layer 600 may be a hydrogen containing layer. In some embodiments the seam filling layer 600 may have substantially no hydrogen within the layer. In some embodiments, the seam-filling layer 600 constitutes an amorphous silicon layer. In some embodiments, the seam filling layer 600 constitutes an amorphous carbon layer. In some embodiments, the seam filling layer 600 comprises at least one of a silicon containing seam filling layer or a carbon containing seam filling layer. After healing the seam 208 with the seam filling layer 600, some excess seam filling layer 600 may also be deposited on top of the material 206 and outside of the seams 208. This excess may be removed during a later removal process. This removal can be completed in a batch or a single wafer process.

Embodiments of the present disclosure provide methods of seam-free gapfilling and seam healing of semiconductor device features. Since the gapfilling and seam healing is seam-free the overall performance of the semiconductor device is improved.

While the foregoing is directed to embodiments of the present disclosure, other and further embodiments of the disclosure may be devised without departing from the basic scope thereof, and the scope thereof is determined by the claims that follow.

What is claimed is:

1. A method for filling features formed on a substrate, the method comprising:
   positioning a substrate having one or more features formed in a surface of a material formed on the substrate in a process chamber;
   exposing the one or more features to at least one precursor at a pressure of 5 bar to 15 bar; and
   forming a gap fill layer over the one or more features to fill the one or more features, wherein the gap fill layer comprises at least one of a silicon-containing film or a carbon-containing gap fill layer.

2. The method of claim 1, wherein the at least one precursor is at least one silicon-containing precursor.

3. The method of claim 2, wherein the at least one silicon-containing precursor comprises at least one of silane ($SiH_4$), disilane ($H_6Si_2$), dichlorosilane (DCS), trisilane ($H_8Si_3$), tetrasilane ($Si_4H_{10}$), tetraethyl orthosilicate ($Si(OC_2H_5)_4$), trimethylamine (TMA), dimethylsilane ($C_2H_8Si$), tetramethyldisilane ($((CH_3)_2SiHSiH(CH_3)_2)$), hexamethyldisilane ($(Si(CH_3)_3)_2$), hexamethyldisiloxane (HMDSO), and trisilyl-pentane ($C_8H_{19}NSi$).

4. The method of claim 2, the one or more features are exposed for a duration of 1 minute to about 180 minutes.

5. The method of claim 1, wherein the gap fill layer constitutes an amorphous silicon or an amorphous carbon film.

6. The method of claim 1, wherein the at least one precursor is at least one carbon-containing precursor.

7. The method of claim 6, wherein the at least one carbon-containing precursor comprises at least one of methane ($CH_4$), acetylene ($C_2H_2$), propene ($C_3H_6$), trimethylamine (TMA), dimethylsilane ($C_2H_8Si$), tetramethyldisilane ($((CH_3)_2SiHSiH(CH_3)_2)$), hexamethyldisilane ($(Si(CH_3)_3)_2$), and hexamethyldisiloxane (HMDSO), trisilyl-pentane ($C_8H_{19}NSi$).

8. The method of claim 1, wherein the at least one precursor is provided at a flow rate of 50 sccm to 1000 sccm.

9. The method of claim 1, wherein a temperature of the process chamber is 150° C. to 450° C.

10. The method of claim 9, wherein a temperature of the substrate is 200° C. to 800° C.

11. A method for filling features formed on a substrate, the method comprising:
    positioning a substrate having one or more features formed in a surface of a material disposed on the substrate in a process chamber, a material disposed over the one or more features and a seam disposed in the material;
    exposing the material to at least one precursor at a pressure of 12 bar to 50 bar; and
    filling the seam with a filling material formed from the at least one precursor, the seam filling material comprising at least one of a silicon containing seam filling layer or a carbon containing seam filling layer.

12. The method of claim 11, wherein exposing the material to the at least one precursor further comprises exposing the material to the at least one precursor at a pressure of 12 bar to 20 bar.

13. The method of claim 11, wherein the filling of the seam heals the seam to form a seam-free material.

14. The method of claim 13, wherein the at least one precursor comprises at least one of silane ($SiH_4$), disilane ($H_6Si_2$), dichlorosilane (DCS), trisilane ($H_8Si_3$), tetrasilane ($Si_4H_{10}$), tetraethyl orthosilicate ($Si(OC_2H_5)_4$), trimethylamine (TMA), dimethylsilane ($C_2H_8Si$), tetramethyldisilane ($((CH_3)_2SiHSiH(CH_3)_2)$), hexamethyldisilane ($(Si(CH_3)_3)_2$), hexamethyldisiloxane (HMDSO), and trisilyl-pentane ($C_8H_{19}NSi$).

15. The method of claim 13, wherein the at least one precursor comprises at least one of methane ($CH_4$), acetylene ($C_2H_2$), propene ($C_3H_6$), trimethylamine (TMA), dimethylsilane ($C_2H_8Si$), tetramethyldisilane ($((CH_3)_2SiHSiH(CH_3)_2)$), hexamethyldisilane ($(Si(CH_3)_3)_2$), and hexamethyldisiloxane (HMDSO), trisilyl-pentane ($C_8H_{19}NSi$).

16. The method of claim 11, wherein a temperature of the process chamber is 150° C. to 450° C., and wherein a temperature of the substrate is 200° C. to 800° C.

17. The method of claim 11, wherein the at least one precursor comprises an element also present in the material.

18. A method for filling features formed on a substrate, the method comprising:
    flowing a precursor containing at least one of silicon or carbon into a processing region of a processing chamber containing a substrate;
    maintaining a pressure of the precursor disposed within the processing region containing the substrate at 5 bar to 15 bar; and
    gapfilling a feature or healing a seam disposed on a material disposed on the substrate disposed within the processing region containing the precursor.

19. The method of claim 18, wherein a temperature of the substrate is 150° C. to 800° C.

20. The method of claim 18, wherein the precursor is heated by a heater before flowing into the processing region.

* * * * *